(12) United States Patent
Watanabe et al.

(10) Patent No.: US 12,341,039 B2
(45) Date of Patent: Jun. 24, 2025

(54) SUBSTRATE PROCESSING APPARATUS AND TEMPERATURE REGULATION METHOD

(71) Applicant: Tokyo Electron Limited, Tokyo (JP)

(72) Inventors: Tatsuya Watanabe, Yamanashi (JP); Yuichi Takenaga, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 18/210,318

(22) Filed: Jun. 15, 2023

(65) Prior Publication Data

US 2023/0416919 A1    Dec. 28, 2023

(30) Foreign Application Priority Data

Jun. 28, 2022  (JP) ................................. 2022-103981

(51) Int. Cl.
| | |
|---|---|
| H01L 21/67 | (2006.01) |
| C23C 16/46 | (2006.01) |
| C23C 16/52 | (2006.01) |

(52) U.S. Cl.
CPC ........ H01L 21/67248 (2013.01); C23C 16/46 (2013.01); C23C 16/52 (2013.01); H01L 21/67115 (2013.01)

(58) Field of Classification Search
CPC . C23C 16/45546; C23C 16/46; C23C 16/481; C23C 16/52; H01L 21/67017; H01L 21/67115; H01L 21/67248; H01L 21/67303
See application file for complete search history.

(56) References Cited

U.S. PATENT DOCUMENTS

| | | | | |
|---|---|---|---|---|
| 5,517,594 A | * | 5/1996 | Shah ................. | H01L 21/67248 392/416 |
| 6,622,104 B2 | * | 9/2003 | Wang .................. | G01K 15/005 700/32 |
| 6,951,998 B2 | * | 10/2005 | Nanno ............... | G05D 23/1919 236/78 D |

(Continued)

FOREIGN PATENT DOCUMENTS

JP    2009-111042 A    5/2009

*Primary Examiner* — Benjamin Kendall
(74) *Attorney, Agent, or Firm* — Venjuris, P.C.

(57) ABSTRACT

A substrate processing apparatus includes: a processing container, a temperature adjustment unit, and a controller. The controller includes a calculation unit that calculates a correction temperature for uniformizing a film thickness within a plane of each substrate, a first temperature change amount calculation unit that calculates a first temperature change amount based on the correction temperature and a thermal model, a second temperature change amount calculation unit that calculates a second temperature change amount based on a simulation of a temperature sequence using the calculated correction temperature, a temperature comparison unit that calculates a temperature difference between the first and second temperature change amounts, a film thickness information calculation unit that calculates information on a film thickness, and a temperature regulation information calculation unit that calculates temperature regulation information to uniformize a film thickness for each of a plurality of zones based on the information on the film thickness.

9 Claims, 7 Drawing Sheets

(56) References Cited

U.S. PATENT DOCUMENTS

| | | | | |
|---|---|---|---|---|
| 7,258,892 B2* | 8/2007 | Beaman | ................... | C23C 16/46 |
| | | | | 219/490 |
| 7,517,141 B2* | 4/2009 | Patel | .................... | C23C 16/345 |
| | | | | 374/45 |
| 2003/0109071 A1* | 6/2003 | Wang | .................... | H01L 21/324 |
| | | | | 438/799 |
| 2004/0215365 A1* | 10/2004 | Obara | ..................... | H01L 22/20 |
| | | | | 257/E21.525 |
| 2009/0110824 A1* | 4/2009 | Takenaga | ................ | C23C 16/52 |
| | | | | 118/724 |

\* cited by examiner

| | TOP | C-T | CNT | C-B | BTM |
|---|---|---|---|---|---|
| TVS1 | 19.8 | 15.8 | 12.6 | 6.2 | 10.5 |
| TVS2 | 18.3 | 13.8 | 14.6 | 5.8 | 9.0 |
| TVS3 | −13.6 | −11.2 | −10.0 | −8.1 | 1.6 |

SUBSTRATE PROCESSING APPARATUS AND TEMPERATURE REGULATION METHOD

CROSS-REFERENCE TO RELATED APPLICATIONS

This application is based on and claims priority from Japanese Patent Application No. 2022-103981, filed on Jun. 28, 2022, with the Japan Patent Office, the disclosure of which is incorporated herein in its entirety by reference.

TECHNICAL FIELD

The present disclosure relates to a substrate processing apparatus and a temperature regulation method.

BACKGROUND

Japanese Patent Laid-Open Publication No. 2009-111042 discloses a substrate processing apparatus, which supplies a processing gas while heating a plurality of substrates (wafers) in a processing container, thereby forming a desired film on the surface of the substrates. In order to optimize a temperature control during the film formation, the substrate processing apparatus calculates temperature conditions to achieve the uniformity of film thickness among the individual substrates (inter-plane uniformity), and then, calculates temperature conditions to achieve the uniformity of film thickness within the plane of each substrate (in-plane uniformity).

However, when the film formation is performed based on the temperature conditions of the in-plane uniformity, the previously calculated inter-plane uniformity among the individual substrates may deteriorate. In this case, the substrate processing apparatus is required to re-regulate the previously calculated inter-plane uniformity after calculating the temperature conditions of the in-plane uniformity.

SUMMARY

According to an aspect of the present disclosure, a substrate processing apparatus includes: a processing container that performs a substrate processing for forming a film on a plurality of substrates; a temperature adjustment unit that adjusts a temperature of the plurality of substrates accommodated in the processing container for each of a plurality of zones set in advance; and a controller that controls an operation of the temperature adjustment unit. The controller includes a calculation unit that calculates a correction temperature for uniformizing a film thickness within a plane of each substrate based on a thermal model held in advance, for each of the plurality of zones, a first temperature change amount calculation unit that calculates a first temperature change amount for each of the plurality of zones based on the correction temperature calculated by the calculation unit and the thermal model, a second temperature change amount calculation unit that performs a simulation of a temperature sequence using the correction temperature calculated by the calculation unit, thereby calculating a second temperature change amount based on the simulation for each of the plurality of zones, a temperature comparison unit that calculates a temperature difference between the first and second temperature change amounts for each of the plurality of zones, a film thickness information calculation unit that calculates information on a film thickness of a film being formed, for each of the plurality of zones based on the calculated temperature difference, and a temperature regulation information calculation unit that calculates temperature regulation information for uniformizing the film thickness for each of the plurality of zones based on the information on the film thickness.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
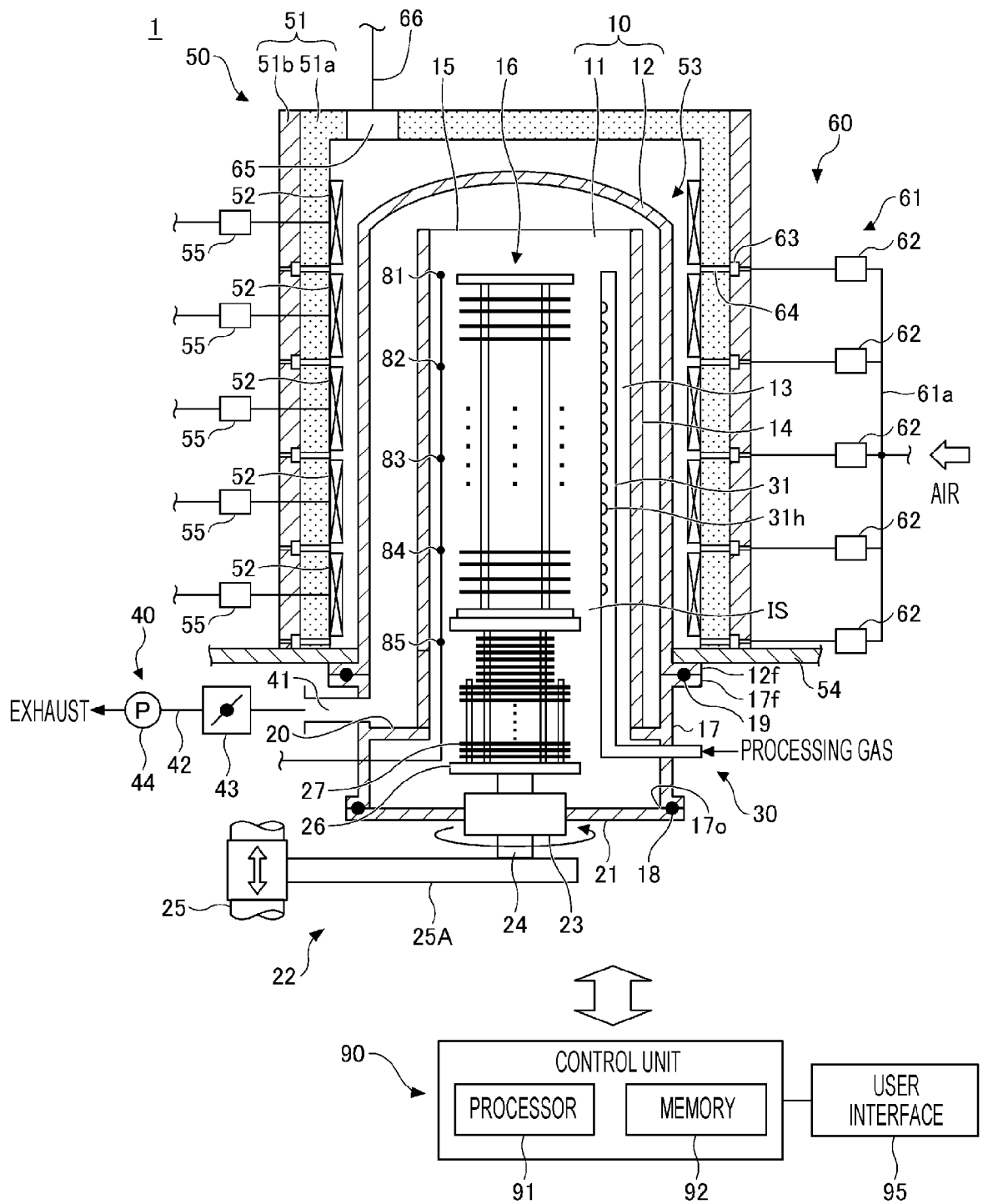
FIG. 1 is a view schematically illustrating an entire configuration of a substrate processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments for implementing the present disclosure will be described with reference to the drawings. In the respective drawings, the same components will be denoted by the same reference numerals, and overlapping descriptions thereof may be omitted.

As illustrated in FIG. 1, a substrate processing apparatus 1 according to an embodiment is configured as a vertical type film forming apparatus, which arranges a plurality of substrates W along the vertical direction (the up-down direction) in a row, and performs a substrate processing for forming a desired film on the surfaces of the substrates W. The substrates W may be, for example, semiconductor substrates such as silicon wafers or compound semiconductor wafers, or glass substrates.

The substrate processing apparatus 1 includes a processing container 10 that accommodates the plurality of substrates W, and a temperature adjustment furnace 50 disposed around the processing container 10. The substrate processing apparatus 1 further includes a control unit 90 that controls an operation of each component of the substrate processing apparatus 1.

The processing container 10 is formed in a cylindrical shape that extends vertically. Inside the processing container 10 is formed an interior space IS, in which the plurality of substrates W may be arranged along the vertical direction in a row. The processing container 10 includes, for example, a cylindrical inner cylinder 11 opened at the upper end (ceiling) and the lower end thereof, and a cylindrical outer cylinder 12 disposed outside the inner cylinder and having the ceiling while being opened at the lower end thereof. The inner cylinder 11 and the outer cylinder 12 are made of a heat resistant material such as quartz, and form a double structure by being arranged coaxially with each other. Without being limited to the double structure, the processing container 10 may have a single-cylinder structure or a multiple structure including three or more cylinders.

The inner cylinder 11 has a larger diameter than the diameter of each substrate W, and has an axial length enough to accommodate the individual substrates W (e.g., equal to or more than the arrangement height of the individual substrates W). Inside the inner cylinder 11 is formed a processing space (a portion of the interior space IS) where the substrate processing is performed by ejecting a gas to each accommodated substrate W. An opening 15 is provided at the upper end of the inner cylinder 11 to communicate with the processing space, and allow the gas to flow out into a distribution space (another portion of the interior space IS) between the inner cylinder 11 and the outer cylinder 12.

At a circumferential position of the inner cylinder 11, an accommodation portion 13 is provided along the vertical direction to accommodate a gas nozzle 31. For example, the accommodation portion 13 is provided inside a convex portion 14 formed by making a portion of the side wall of the inner cylinder 11 project radially outward. Instead of the opening 15 at the upper end of the inner cylinder 11, a vertically elongated opening (not illustrated) may be formed at an appropriate position on the circumferential wall of the inner cylinder 11 (e.g., on the opposite side to the accommodation portion 13 across the central axis).

The outer cylinder 12 has a larger diameter than the inner cylinder 11, covers the inner cylinder 11 in a non-contact manner, and forms the outer shape of the processing container 10. The distribution space between the inner cylinder 11 and the outer cylinder 12 is formed above and beside the inner cylinder 11, and distributes an upwardly moving gas vertically downward.

The lower end of the processing container 10 is supported by a cylindrical manifold 17 formed of stainless steel. For example, the manifold 17 includes a manifold-side flange 17$f$ at the upper end thereof. The manifold-side flange 17$f$ fixes and supports an outer cylinder-side flange 12$f$ formed at the lower end of the outer cylinder 12. A seal member 19 is provided between the outer cylinder-side flange 12$f$ and the manifold-side flange 17$f$ to airtightly seal the outer cylinder 12 and the manifold 17.

The manifold 17 further includes an annular support 20 on the upper inner wall thereof. The support 20 protrudes radially inward, and fixes and supports the lower end of the inner cylinder 11. A lid 21 is removably mounted at a lower-end opening 17$o$ of the manifold 17.

The lid 21 is configured as a portion of a substrate disposition unit 22 that disposes a wafer boat 16 holding the individual substrates W in the processing container 10. The lid 21 is formed of, for example, stainless steel and has a disk shape. In a state where the individual substrates W are disposed in the interior space IS, the lid 21 airtightly seals the lower-end opening 17$o$ of the manifold 17 via a seal member 18 provided at the lower end of the manifold 17.

A rotary shaft 24 penetrates the center of the lid 21 to rotatably support the wafer boat 16 via a magnetic fluid seal unit 23. The lower portion of the rotary shaft 24 is supported on an arm 25A of a lift mechanism 25 configured with, for example, a boat elevator. By moving the arm 25A of the lift mechanism 25 up and down, the substrate processing apparatus 1 may move the lid 21 and the wafer boat 16 up and down together, thereby inserting and removing the wafer boat 16 into/from the processing container 10.

A rotation plate 26 is provided on the upper end of the rotary shaft 24. The wafer boat 16 holding the individual substrates W is supported on the rotation plate 26 via a heat insulation unit 27. The wafer boat 16 is configured with shelves capable of holding the substrates W along the vertical direction at predetermined intervals. In a state where the wafer boat 16 holds the individual substrates W, the surfaces of the substrates W extend horizontally with respect to each other.

A gas supply unit 30 is inserted into the processing container 10 through the manifold 17. The gas supply unit 30 introduces a gas such as a processing gas, a purge gas, and a cleaning gas into the interior space IS of the inner cylinder 11. The gas supply unit 30 includes the gas nozzle 31 that introduces, for example, the processing gas, the purge gas, and the cleaning gas. While FIG. 1 illustrates only one gas nozzle 31, the gas supply unit 30 may include a plurality of gas nozzles 31. For example, the plurality of gas nozzles 31 may be provided for gas types, respectively, such as the processing gas, the purge gas, and the cleaning gas.

The gas nozzle 31 is an injector tube made of quartz, and is provided to extend vertically inside the inner cylinder 11 and be bent in an L-shape at the lower end thereof thereby penetrating the manifold 17 from inside to outside. The gas nozzle 31 is fixed to and supported by the manifold 17. The gas nozzle 31 has a plurality of gas holes 31$h$ at predetermined intervals along the vertical direction, and discharges a gas in the horizontal direction through each gas hole 31$h$. The interval of vertically adjacent gas holes 31$h$ is set to be the same as, for example, the interval of vertically adjacent substrates W supported on the wafer boat 16. The vertical position of each gas hole 31$h$ is set to be located in the middle between vertically adjacent substrates W. As a result, each gas hole 31$h$ may smoothly distribute a gas into the gap between vertically adjacent substrates W.

The gas supply unit 30 supplies, for example, the processing gas, the purge gas, and the cleaning gas to the gas nozzle 31 inside the processing container 10, while controlling the flow rate of the gas outside the processing container 10. An appropriate processing gas may be selected according to a type of film to be formed on the substrates W. For example, when a silicon oxide film is formed, a silicon-containing gas such as dichlorosilane (DCS) gas and an oxidizing gas such as ozone ($O_3$) gas may be used as the processing gas. As for the purge gas, for example, nitrogen ($N_2$) gas and argon (Ar) gas may be used.

A gas exhaust unit 40 exhausts the gas inside the processing container 10 to the outside. The gas supplied by the gas supply unit 30 moves from the processing space of the inner cylinder 11 to the distribution space, and then, is exhausted through a gas outlet 41. The gas outlet 41 is formed in the upper portion of the manifold 17 above the support 20. An exhaust path 42 of the gas exhaust unit 40 is connected to the gas outlet 41. The gas exhaust unit 40 includes a pressure regulation valve 43 and a vacuum pump 44 in this order from upstream to downstream of the exhaust path 42. The gas exhaust unit 40 sucks the gas inside the processing container 10 by the vacuum pump 44, and regulates the flow rate of the gas being exhausted by the pressure regulation valve 43, so as to regulate the pressure in the processing container 10.

A temperature sensor 80 is provided in the interior space IS of the processing container 10 (e.g., the processing space of the inner cylinder 11) to detect the temperature inside the processing container 10. The temperature sensor 80 includes a plurality of (five in this embodiment) thermometers 81 to 85 at different vertical positions thereof. As for the plurality of thermometers 81 to 85, for example, thermocouples or resistance thermometers may be used. The thermometers 81 to 85 are provided at positions corresponding to a plurality of zones, respectively, which is set along the vertical direction of the processing container 10 as described later. The temperature sensor 80 transmits the temperature detected by each of the plurality of thermometers 81 to 85 to the control unit 90.

Meanwhile, the temperature adjustment furnace 50 is formed in a cylindrical shape covering the entire processing container 10, and heats and cools the individual substrates W accommodated in the processing container 10. Specifically, the temperature adjustment furnace 50 includes a cylindrical housing 51 having a ceiling, and a heater 52 provided inside the housing 51.

The housing 51 is formed larger than the processing container 10, and its central axis is located at substantially the same position as the central axis of the processing container 10. For example, the housing 51 is attached to the upper surface of a base plate 54, to which the outer cylinder-side flange 12f is fixed. The housing 51 is installed while being spaced apart from the outer peripheral surface of the processing container 10, so that a temperature adjustment space 53 is formed between the outer peripheral surface of the processing container 10 and the inner peripheral surface of the housing 51. The temperature adjustment space 53 is formed to be continuous beside and above the processing container 10.

The housing 51 includes a heat insulation unit 51a that has a ceiling and covers the entire processing container 10, and a reinforcement unit 51b that reinforces the heat insulation unit 51a on the outer peripheral side of the heat insulation unit 51a. That is, the sidewall of the housing 51 has the stacked structure of the heat insulation unit 51a and the reinforcement unit 51b. The heat insulation unit 51a is formed mainly of, for example, silica or alumina, which suppresses a heat transfer inside the heat insulation unit 51a. The reinforcement unit 51b is formed of a metal such as stainless steel. In order to suppress a heat influence on the outside of the temperature adjustment furnace 50, the outer peripheral side of the reinforcement unit 51b is covered with a water-cooled jacket (not illustrated).

The heater 52 of the temperature adjustment furnace 50 may adopt an appropriate configuration to heat the plurality of substrates W in the processing container 10. As the heater, for example, an infrared heater may be used, which radiates infrared rays to heat the processing container 10. In this case, the heater 52 is formed in a linear shape, and held in a spiral, ring, arc, shank, or meandering shape via a holding unit (not illustrated) on the inner peripheral surface of the heat insulation unit 51a.

The heater 52 is divided into a plurality of (five in this embodiment) heaters along the vertical direction of the temperature adjustment furnace 50, and a temperature adjustment driver 55 is connected to each heater. The temperature adjustment driver 55 is connected to the control unit 90, and heats its connected heater 52 by feeding a power regulated under the control of the control unit 90 to the heater 52. Thus, the substrate processing apparatus 1 may regulate the temperature of the processing container 10 independently for each of the plurality of zones where the plurality of divided heaters 52 are provided. Hereafter, the plurality of zones set in the processing container 10 will also be referred to as "TOP," "C-T," "CTR," "C-B," and "BTM" in this order from above.

The temperature adjustment furnace 50 further includes an external distribution unit 60 that distributes a cooling gas in the temperature adjustment space 53 to cool the processing container 10 during the substrate processing. Specifically, the external distribution unit 60 includes an external supply line 61 and flow rate regulators 62, which are provided outside the temperature adjustment furnace 50, supply flow paths 63 provided in the reinforcement unit 51b, and supply holes 64 provided in the heat insulation unit 51a. In the external supply line 61, a temperature regulation unit (e.g., a heat exchanger or a radiator) may be provided to regulate the temperature of the air flowing into the temperature adjustment space 53.

The external supply line 61 is connected to a blower (not illustrated), which supplies air toward the temperature adjustment furnace 50. The external supply line 61 branches into a plurality of branch lines 61a at intermediate positions. The flow rate regulators 62 are provided in the plurality of branch lines 61a, respectively, and each regulate the flow rate of the air distributed through each branch line 61a. The plurality of flow rate regulators 62 may each independently change the flow rate of the air under the control of the control unit 90. The supply flow paths 63 are formed at a plurality of locations along the axial direction of the reinforcement unit 51b (the vertical direction), and each extends circumferentially in an annular shape inside the cylindrical reinforcement unit 51b. Each supply hole 64 is formed to penetrate the heat insulation unit 51a to communicate with each supply flow path 63, and ejects the air introduced into each supply flow path 63 toward the temperature adjustment space 53.

The external distribution unit 60 further includes an exhaust hole 65 in the ceiling of the housing 51 to discharge the air supplied into the temperature adjustment space 53. The exhaust hole 65 is connected to an external exhaust line 66 provided outside the housing 51. The external exhaust line 66 exhausts the air of the temperature adjustment space 53 toward an appropriate disposal unit. Alternatively, the external distribution unit 60 may be configured such that the external exhaust line 66 is connected to the external supply line 61 to circulate the air used in the temperature adjustment space 53.

The control unit 90 of the substrate processing apparatus 1 may be a computer including, for example, a processor 91, a memory 92, and an input/output interface (not illustrated). The processor 91 may be one of a central processing unit (CPU), a graphics processing unit (GPU), an application specific integrated circuit (ASIC), a field-programmable gate array (FPGA), and circuits including multiple discrete semiconductors, or a combination thereof. The memory 92 is an appropriate combination of a volatile memory and a non-volatile memory (e.g., a compact disk, a digital versatile disk (DVD), a hard disk, and a flash memory).

The memory 92 stores programs for operating the substrate processing apparatus 1 and recipes such as process conditions for the substrate processing. The processor 91 reads and executes the programs of the memory 92, so as to control each component of the substrate processing apparatus 1. The control unit 90 may be configured with a host computer or multiple client computers, which communicate information via a network.

A user interface 95 is connected to the control unit 90 via the input/output interface. The user interface 95 may be, for example, a touch panel (input/output device), a monitor, a speaker, a keyboard, a mouse, or a microphone. The control unit 90 receives a recipe input by a user for the substrate processing apparatus 1 via the user interface 95, and controls each component of the substrate processing apparatus 1 based on the recipe. When information is received from each component during, for example, the substrate processing, the control unit 90 appropriately notifies the information of the substrate processing (e.g., a status and errors) via the user interface 95.

Next, descriptions will be made on a temperature regulation method that sets a temperature to adjust the temperature of each substrate W by the temperature adjustment furnace 50 during the film formation on the substrates W by the substrate processing apparatus 1, with reference to FIG. 2. In the (upper and lower) graphs of FIG. 2, the horizontal axis represents time, and the vertical axis represents control temperatures in the temperature adjustment furnace 50.

When the heaters 52 of the plurality of zones (TOP, C-T, CTR, C-B, and BTM) are temporarily heated at the same heating rate, the individual substrates W arranged along the vertical direction in the interior space IS of the processing container 10 are heated at different temperatures. For example, a heated gas rises in the processing container 10. Therefore, the temperature of a substrate W disposed at the vertical lower side of the processing container 10 likely becomes lower than the temperature of a substrate W disposed at the vertical upper side of the processing container 10. The temperature difference occurring among the individual substrates W also causes a difference in film thickness of a film formed on each substrate W. Further, since the temperatures of the individual substrates W are also affected by, for example, the structure of the processing container 10, the flow of a processing gas, and the arrangement of the heaters 52, the temperatures of the substrates W may not necessarily increase in an order toward the vertical upper side.

The control unit 90 of the substrate processing apparatus 1 performs an inter-plane uniformity regulation to reduce the temperature difference among the individual substrates W arranged along the vertical direction, thereby achieving the film thickness uniformity among the substrates W. As illustrated in the upper graph of FIG. 2, in the inter-plane uniformity regulation, different temperatures are set for the respective zones in the substrate processing, to achieve the temperature uniformity among the individual substrates W. For example, the control unit 90 regulates the temperature of each zone (TOP, C-T, CTR, C-B, and BTM) to shift in the range of about 0° C. to about ±5° C. relative to a target temperature of a recipe. Accordingly, the vertical temperatures are regulated during the substrate processing, so that the uniformity in film thickness of a film formed on the individual substrates W is implemented.

Further, since each substrate W is heated or cooled from the outer side of the processing container 10 by the temperature adjustment furnace 50, the temperature difference also occurs within the plane of each substrate W. For example, when the temperature is raised during the substrate processing, the temperature of the outer peripheral side of each substrate W near the temperature adjustment furnace 50 rises rapidly, while the temperature of the central side of the substrate W rises slowly. In contrast, when the temperature is lowered during the substrate processing, the temperature of the outer peripheral side of each substrate W near the temperature adjustment furnace 50 drops rapidly, while the temperature of the central side of the substrate W drops slowly. The temperature difference occurring within the plane of each substrate W also causes the difference in film thickness of a film formed within the plane of each substrate W.

Therefore, after the inter-plane uniformity regulation described above, the control unit 90 performs an in-plane uniformity regulation to implement the uniformity of temperature distribution within the plane of each substrate W (in other words, the in-plane film thickness uniformity). In the in-plane uniformity regulation, the in-plane temperature distribution of each substrate W is regulated by setting a plurality of steps for changing the temperature during the substrate processing.

Descriptions will be made on an example of a timing chart in a case where the in-plane uniformity regulation is performed during the substrate processing, with reference to the lower graph of FIG. 2. The control unit 90 stops heating the heaters 52 of the respective zones (or heats the heaters 52 at a set standby temperature) for a time period from t0 to t1 until the wafer boat 16 holding the individual substrates W is carried into the processing container 10. As a result, the interior space of the processing container 10 is maintained generally constant at an appropriate temperature (e.g., room temperature or standby temperature).

After the timing t1 when the individual substrates W are accommodated in the processing container 10, the control unit 90 performs a process of driving the heaters 52 of the respective zones to raise the temperature of the processing container 10 at a constant rate for a time period from t1 to t2. Here, as described above, the control unit 90 have set different temperatures for the heaters 52 of the respective zones by the inter-plane uniformity regulation. Accordingly, the heaters 52 of the respective zones are heated to the different set temperatures.

Next, the control unit 90 performs a process of maintaining the driving of the heaters 52 of the respective zones at the state of the set temperatures over a certain time period between t2 and t3. Even though the heaters 52 reach the set temperatures by the temperature raising process, due to the thermal inertia, it may take some time until the actual temperatures of the individual substrates W stabilize. Therefore, the subsequent process stands by until the temperatures of the individual substrates W stabilize.

After the timing t3, the control unit 90 proceeds with a step of preparing the film formation on the substrates W to perform the in-plane uniformity regulation during the film formation. Specifically, for a time period from t3 to t4, the control unit 90 performs a process of raising (or lowering) the temperatures of the respective zones to set temperatures of the preparation step at a constant rate (TVS1: temperature changing process). Further, for a time period from t4 to t5, the control unit 90 performs a process of maintaining the temperatures of the respective zones at the state of the set temperatures of the preparation step (TVS2: standby process). In the standby process, a control may be performed to slightly change the set temperatures (raise or lower the temperatures). Further, the control unit 90 may not perform the standby process.

After TVS1 and TVS2 are performed, the control unit 90 terminates the preparation step of the film formation, and actually starts the film formation on each substrate W. For a time period from t5 to t6, the control unit 90 supplies a processing gas from the gas supply unit 30 into the interior space IS of the processing container 10, while lowering (or raising) the temperatures of the respective zones at a constant rate (TVS3: film formation process). The supplied processing gas adheres to the surface of each heated substrate W and is deposited as a film on the substrate W.

After the timing t6, the control unit 90 stops the supply of the processing gas, and performs a control to restore the temperatures of the individual substrates W as a follow-up process of the film formation. For example, for a time period between t6 and t7, the control unit 90 performs a process of raising the temperatures of the heaters 52 of the respective zones at a constant rate. For a time period from t7 to t8, the control unit 90 further performs a process of maintaining the temperatures of the heaters 52 of the respective zones constant. Thereafter, for a time period from t8 to t9, the control unit 90 performs a process of lowering the temperatures of the respective zones at a constant rate. When the temperature of the processing container 10 is lowered, the control unit 90 may stop the driving of the heaters 52 and distribute air into the temperature adjustment space 53 by the external distribution unit 60, thereby cooling the processing container 10.

After the timing t9, in a state where an appropriate temperature (e.g., room temperature or standby temperature) is maintained, the control unit 90 controls the lift mechanism 25 to carry out the wafer boat 16 holding the individual substrates W from the processing container 10.

In order to achieve the film thickness uniformity on each substrate W during the substrate processing, the time period from t3 to t6 for performing TVS1 to TVS3 is important. In particular, TVS3 is a process of supplying the processing gas to perform the film formation on each substrate W, and significantly affects the film thickness distribution on each substrate W. Meanwhile, during the film formation, the in-plane temperature distribution of each substrate W also varies by changing the temperature or time period of TVS1 or the temperature or time period of TVS2, which thus affects the film thickness distribution of each substrate W. Compared to TVS3, TVS1 and TVS2 have a larger degree of freedom in changing temperature conditions, and may easily be used for the control to implement the film thickness uniformity. In contrast, since TVS3 is the film formation process itself, its degree of freedom in changing temperature conditions is restricted in relation to the target film thickness of the film formation.

The temperature conditions of TVS1 to TVS3 are set individually as parameters such as the set temperature of each zone of TVS1 (timing t3), the set temperature of each zone of TVS2, the set temperature of each zone of TVS3 (timing t6), and the time periods of TVS1, TVS2, and TVS3. Hereinafter, among the temperature conditions calculated in the in-plane uniformity regulation, the set temperatures of respective TVS1 to TVS will also be referred to as correction temperatures. The temperature conditions of TVS1 to TVS3 are calculated by an optimization calculation using target temperatures set by a user in a recipe and thermal models. Since the aforementioned Japanese Patent Laid-Open Publication No. 2009-111042 discloses the specific calculation method of the in-plane uniformity regulation, detailed description of the method is omitted herein.

Figure 3:
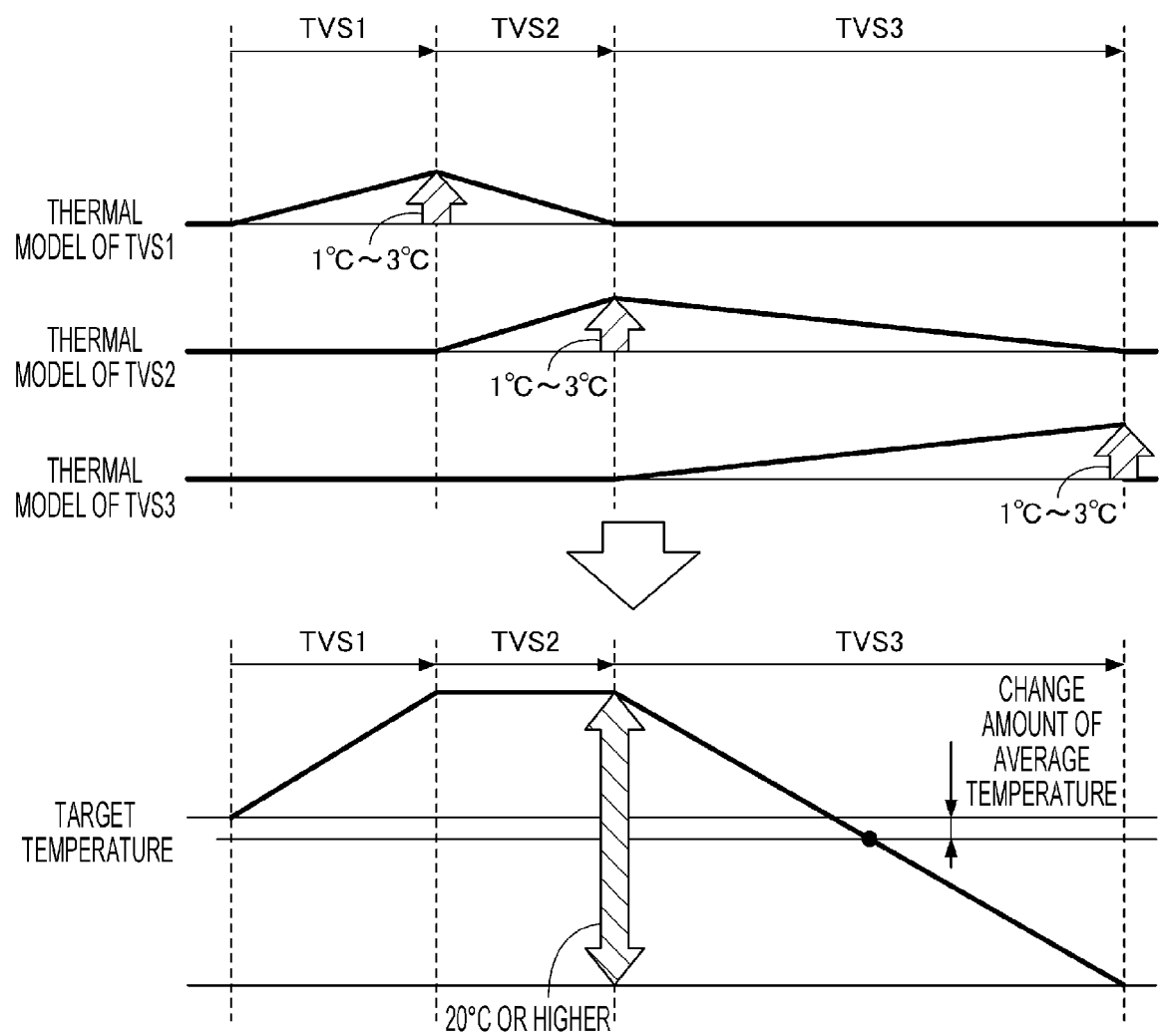
FIG. 3 is a view illustrating an example of a temperature regulation for the in-plane uniformity regulation based on thermal models.

As illustrated in FIG. 3, the thermal models of the in-plane uniformity regulation are generated as a thermal model of TVS1, a thermal model of TVS2, and a thermal model of TVS3 for each of the plurality of zones. Each thermal model is obtained by simulating a temperature changing relative to the target temperature of TVS3 (the lower figure of FIG. 3) when the set temperature in each process of TVS1 to TVS3 is changed in the range of 1° C. to 3° C. (the upper figure of FIG. 3). The lower figure of FIG. 3 is a graph illustrating the temperature change amount of TVS3 in one of the plurality of zones.

Each thermal model is generated as map information (table), in which the set temperatures of each of the plurality of zones and the temperature change amount of each substrate W are associated with each other by conducting, for example, experiments or simulations when the substrate processing apparatus 1 is manufactured, and is stored in the memory 92. Specifically, the thermal model of TVS1 is generated by examining the change amount of the average temperature of TVS3 when the set temperature of TVS1 is changed in the range of 1° C. to 3° C. (relative to the unit temperature change amount of TVS1). Similarly, the thermal model of TVS2 is generated by examining the change amount of the average temperature of TVS3 when the temperature of TVS2 is changed in the range of 1° C. to 3° C. (relative to the unit temperature change amount of TVS2). The thermal model of TVS3 is generated by examining the change amount of the average temperature of TVS3 (relative to the unit temperature change amount of TVS3) when the temperature of TVS3 is changed in the range of 1° C. to 3° C.).

Figures 4A, 4B:
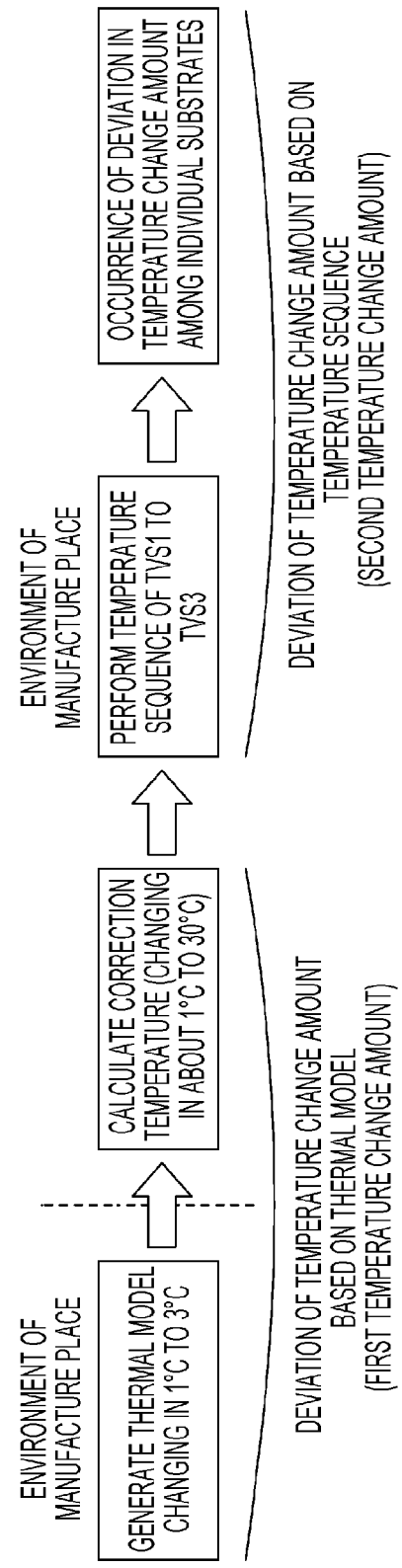
FIG. 4A is a table illustrating correction temperatures of the in-plane uniformity regulation that are calculated for each of a plurality of zones.
FIG. 4B is a view illustrating the flow from the generation of the thermal models to an actual substrate processing based on the correction temperatures.

Meanwhile, the temperature conditions of each zone that are set by the in-plane uniformity regulation (the correction temperatures of TVS1 to TVS3) also affect the previously performed inter-plane uniformity regulation. The temperature of each process in the thermal models used for the in-plane uniformity regulation is changed in the range of 1° C. to 3° C. as described above, while the temperature in the film formation process (TVS3) is raised or lowered in a larger temperature range than that in the thermal models. For example, as represented in the table of FIG. 4A, the correction temperatures calculated in the in-plane uniformity regulation have temperature values for the plurality of zones, respectively, and TVS1 to TVS3, respectively, but these temperature values are calculated in a larger temperature range (the temperature difference of about 10° C. to about 30° C.) than the range of 1° C. to 3° C. in the thermal models. The temperature values represented in the table of FIG. 4A are relative temperatures to the respective target temperatures of TVS1 to TVS3.

As illustrated in FIG. 4B, the environment, in which the thermal models of the substrate processing apparatus 1 are generated, is different from the environment, in which the substrate processing apparatus 1 actually performs the substrate processing. In the actual environment, the control unit 90 sets the correction temperatures in a large temperature range based on the thermal models, and performs TVS1 to TVS3 based on the correction temperatures. As a result, in actual TVS3, a slight deviation occurs in the temperature change amount among the individual substrates W. The deviation in temperature change amount is, for example, 1° C. or lower (about 0.1° C. to about 0.6° C.), but affects the film thickness of a film formed on each substrate W. In other words, the deterioration of the inter-plane uniformity among the individual substrates W after the in-plane uniformity regulation is caused mainly from the presence of a gap between the temperature conditions when the thermal models are generated and the temperature conditions of the temperature sequence of TVS1 to TVS3 when the film formation is actually performed.

Here, the substrate processing apparatus 1 may consider performing the inter-plane uniformity regulation among the individual substrates W again after setting the temperature conditions (correction temperatures) for the in-plane uniformity regulation. However, when the inter-plane uniformity regulation is performed again to meet the environment of the substrate processing apparatus 1, the substrate processing needs to be performed multiple times for the regulation. Since it takes significant man-hours to perform the inter-plane uniformity regulation again, the temperature regulation method may not avoid the increase in time or cost for the regulation.

Therefore, the substrate processing apparatus 1 according to the present embodiment is configured to automatically perform an evaluation considering the inter-plane uniformity regulation, during the in-plane uniformity regulation. Specifically, after calculating the correction temperatures, the control unit 90 compares a first temperature change amount using the correction temperatures and the thermal models, with a second temperature change amount obtained from a simulation using the correction temperatures and the temperature sequence of TVS1 to TVS3. This is because the temperature difference between the first and second temperature change amounts (the deviation in temperature change amount) leads to the film thickness deviation among the individual substrates W of the inter-plane uniformity regulation. Then, the control unit 90 calculates a temperature tilt to uniformize the film thickness among the individual substrates W based on the temperature difference. As a result, during the in-plane uniformity regulation, it is possible to obtain temperature regulation information considering the inter-plane uniformity regulation, which simplifies the re-performance of the inter-plane uniformity regulation (or terminates the in-plane uniformity regulation without re-performing the inter-plane uniformity regulation).

Figure 5:
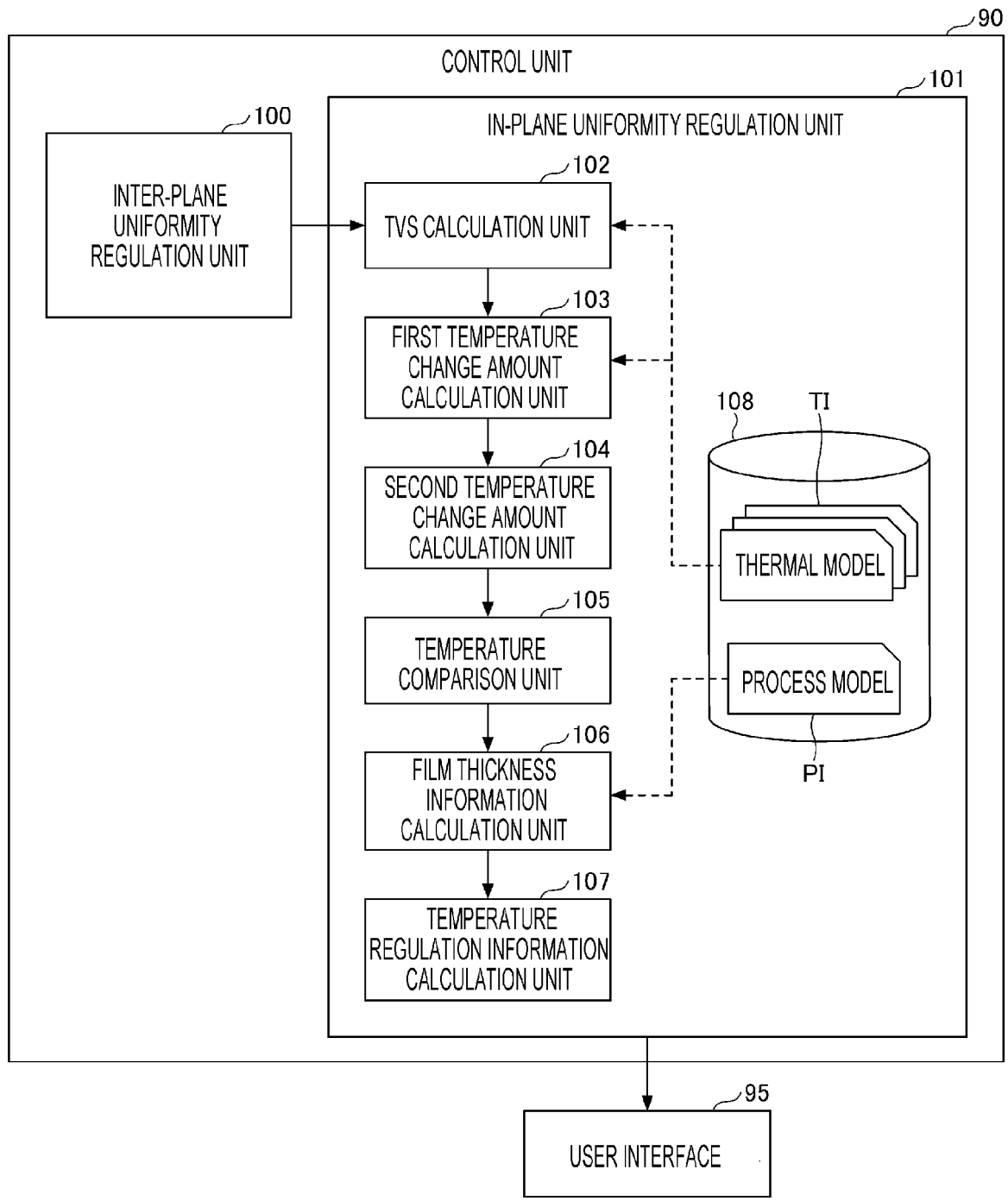
FIG. 5 is a block diagram illustrating functional blocks of a control unit when a temperature regulation method is performed.

Specifically, to implement the temperature regulation method, the control unit 90 includes an inter-plane uniformity regulation unit 100 and an in-plane uniformity regulation unit 101 as illustrated in FIG. 5.

Figure 2:
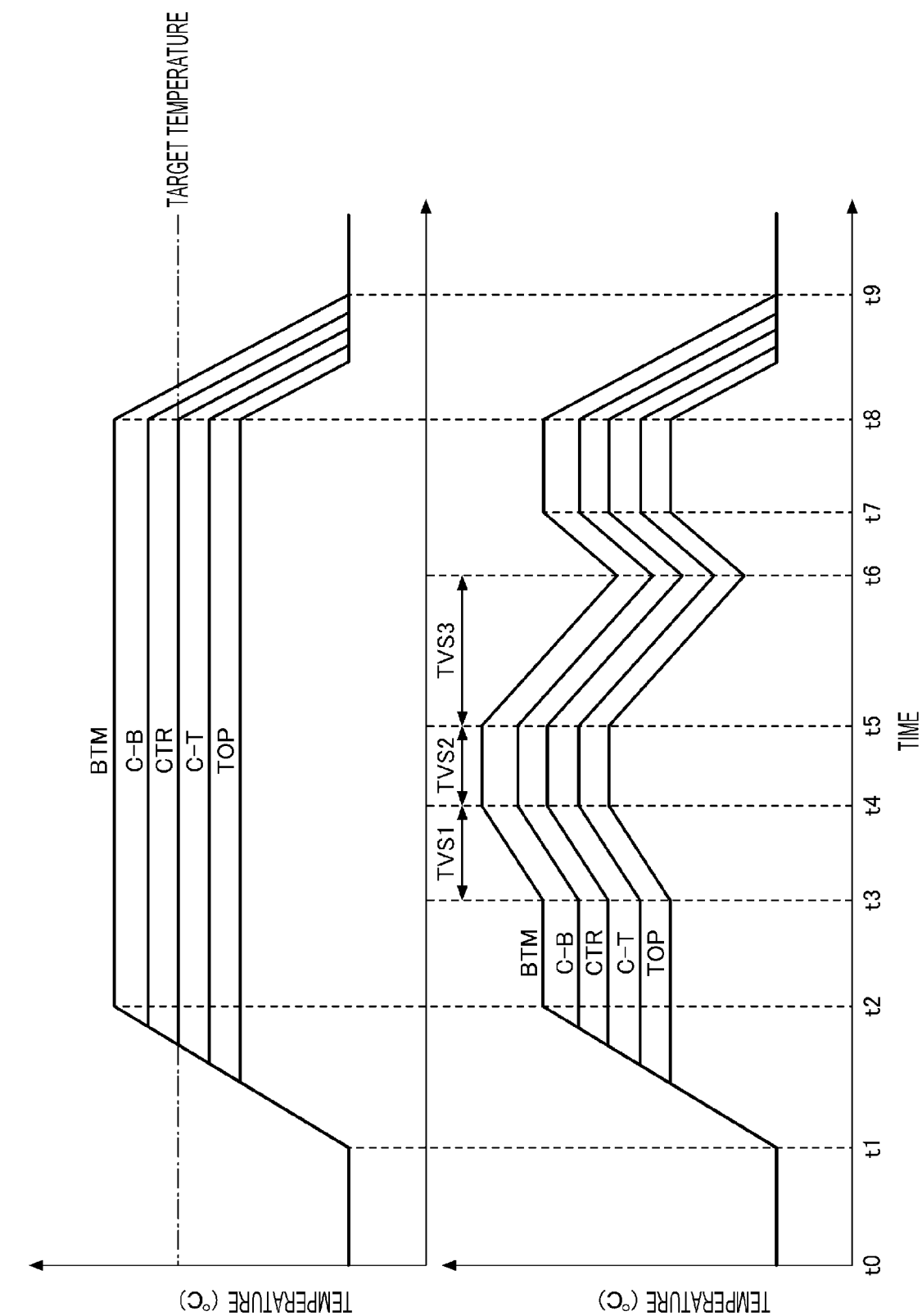
FIG. 2 is a graph schematically illustrating temperature changes of the inter-plane uniformity regulation and the in-plane uniformity regulation.

The inter-plane uniformity regulation unit 100 is a functional unit that sets a target temperature of each zone to achieve the film thickness uniformity among the individual substrates W during the substrate processing (see also the upper graph in FIG. 2). For example, the inter-plane uniformity regulation unit 100 has information on the temperature ratio of each zone (or information on a relative temperature difference) that is set in advance through, for example, experiments or simulations, and calculates a relative temperature of each zone to the target temperature when the target temperature is extracted from a recipe of the substrate processing during the preparation for the substrate processing.

The in-plane uniformity regulation unit 101 is a functional unit that sets the temperature conditions for the plurality of steps (TVS1 to TVS3) to achieve the film thickness uniformity within the plane of each substrate W during the substrate processing. As described above, the temperature conditions of each zone include the set temperatures (correction temperatures) of TVS1 to TVS3 and the time periods of TVS1 to TVS3 (see also, e.g., FIG. 2). In the present embodiment, after the calculation of the correction temperatures, the in-plane uniformity regulation unit 101 performs a process of evaluating the film thickness deviation of each substrate W of the inter-plane uniformity regulation, which is caused by the in-plane uniformity regulation. To this end, inside the in-plane uniformity regulation unit 101 are provided a TVS calculation unit 102, a first temperature change amount calculation unit 103, a second temperature change amount calculation unit 104, a temperature comparison unit 105, a film thickness information calculation unit 106, and a temperature regulation information calculation unit 107.

Further, a storage unit 108 (the memory area of the memory 92) of the in-plane uniformity regulation unit 101 stores map information TI of the thermal models for each of the plurality of zones and map information PI of a process model used by the film thickness information calculation unit 106.

After the calculation of the temperature of each zone by the inter-plane uniformity regulation unit 100, the TVS calculation unit 102 calculates the temperature conditions of the in-plane uniformity regulation for the temperature of each zone. As described above, the TVS calculation unit 102 reads, for example, the target temperature of the recipe of the substrate processing and the map information TI of the thermal models in the storage unit 108, and calculates the correction temperatures of TVS1 to TVS3 and the time periods of TVS1 to TVS3 for each of the plurality of zones through the optimization calculation. The correction temperatures are calculated as information of the temperatures of TVS1 to TVS3 for each of the plurality of zones (see also, e.g., FIG. 4A).

The first temperature change amount calculation unit 103 operates after the calculation of the correction temperatures by the TVS calculation unit 102, to calculate the first temperature change amount based on the thermal models. Specifically, the first temperature change amount calculation unit 103 calculates the change amount of the average temperature of TVS3 when the thermal models are applied, by using the correction temperatures calculated by the TVS calculation unit 102 and the map information TI of the thermal models. In the map information TI of the thermal models, the set temperatures of each zone and the temperature change amount of the substrates W are associated with each other. The first temperature change amount calculation unit 103 may calculate the temperature change amount of the substrates W of TVS3 as the first temperature change amount, by adding up the temperature change amount of the substrates W extracted from the map information TI based on the set temperatures, and the correction temperatures.

The second temperature change amount calculation unit 104 operates after the calculation of the correction temperatures by the TVS calculation unit 102, to simulate the temperature sequence of TVS1 to TVS3 based on the correction temperatures. In the simulation of the temperature sequence, as illustrated in the lower figure of FIG. 3, the temperature change amount when the in-plane uniformity regulation is actually performed is obtained as the simulation result. Further, the second temperature change amount calculation unit 104 simulates the temperature sequence when the correction temperatures are not used (in other words, when the in-plane uniformity regulation is not performed). Then, the second temperature change amount calculation unit 104 takes the difference between the temperature change amount when the in-plane uniformity regulation is performed and the temperature change amount when the in-plane uniformity regulation is not performed, thereby calculating the second temperature change amount (the change amount of the average temperature of TVS3).

The temperature comparison unit 105 compares the first temperature change amount calculated by the first temperature change amount calculation unit 103 with the second temperature change amount calculated by the second temperature change amount calculation unit 104. The second temperature change amount is the temperature change amount when the temperature sequence is actually performed in the substrate processing, whereas the first temperature change amount is the temperature change amount based on the thermal models. Therefore, the temperature difference between the first and second temperature change amounts may indicate the temperature deviation between the temperature change amount based on the thermal models and the actual temperature change amount of the substrates W. Since the first and second temperature change amounts are calculated for each zone, the temperature difference between the first and second temperature change amounts for each zone indicates the temperature deviation of the temperature change amounts of each zone.

The film thickness information calculation unit 106 calculates the film thickness deviation amount among the individual substrates W, based on the temperature deviation of the temperature change amounts of each zone that is calculated by the temperature comparison unit 105. When the temperature deviation of the temperature change amounts of each zone is received from the temperature comparison unit 105, the film thickness information calculation unit 106 reads the map information PI of the process model that is stored in the storage unit 108. The process model describes, in advance, information in which the temperature of a substrate W and the film thickness of the substrate W are associated with each other. Thus, the film thickness information calculation unit 106 may extract the film thickness of the substrates W of each zone from the temperature deviation of the temperature change amounts of each zone, thereby obtaining the film thickness deviation amount occurring among the individual substrates W of each zone.

Figure 6A:
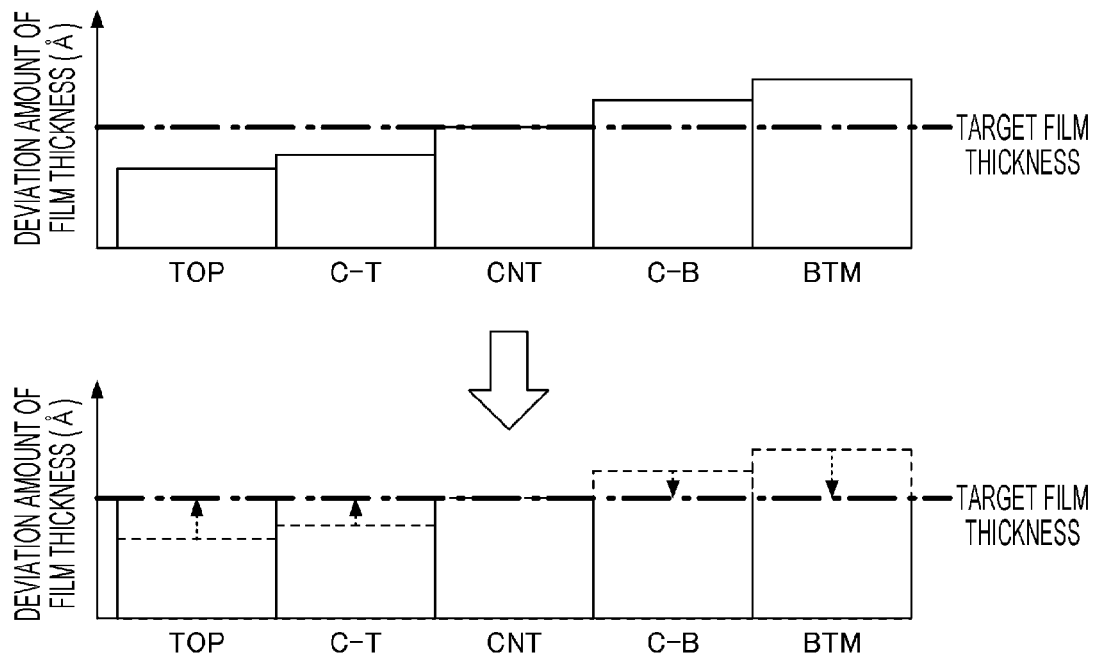
FIG. 6A is a view illustrating an image of a process of eliminating a film thickness deviation.

When the film thickness deviation amount is calculated by the film thickness information calculation unit 106, the temperature regulation information calculation unit 107 calculates a temperature tilt (temperature regulation information) to uniformize the film thicknesses among the individual substrates W in the respective zones (eliminate the film thickness deviation amount). At this time, as illustrated in FIG. 6A, the temperature regulation information calculation unit 107 may input the calculated film thickness deviation amount of each zone as a predicted film thickness, and calculate a temperature tilt for each of the plurality of zones to make uniform with the target film thickness set by the recipe.

Figure 6B:
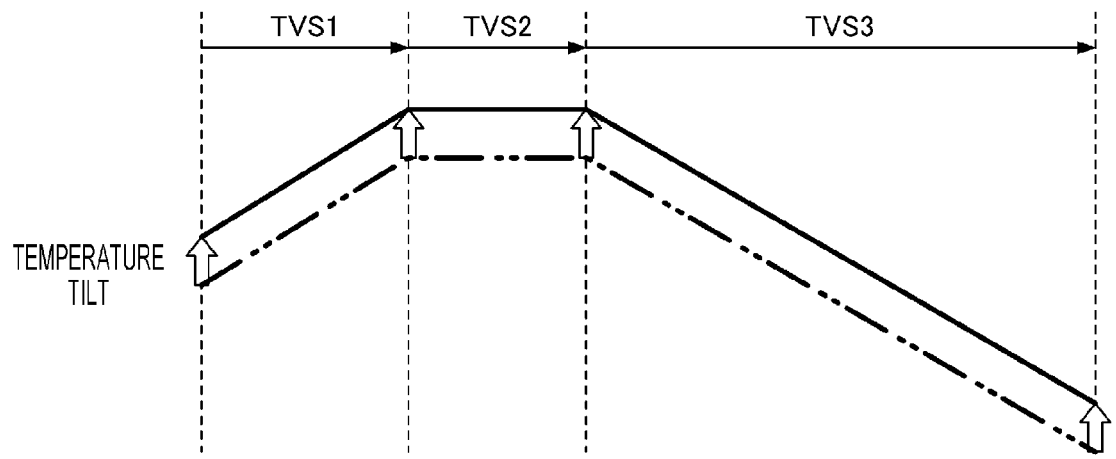
FIG. 6B is a view illustrating an image of a temperature tilt in one zone.

As illustrated in FIG. 6B, the temperature tilt is calculated as information for shifting (raising or lowering) the respective set temperatures of TVS1 to TVS3 set by the in-plane uniformity regulation as a whole. For example, when the temperature shift is performed to increase the film thickness of the substrates W of the TOP zone, a temperature rise amount for the temperature of the TOP zone is calculated based on the film thickness deviation amount and the target film thickness of the TOP zone, and the temperature rise amount is taken as the temperature tilt. Further, for example, when the temperatures shift is performed to decrease the film thickness of the substrates W of the BTM zone, a temperature drop amount for the temperature of the BTM zone is calculated based on the film thickness deviation amount and the target film thickness of the BTM zone, and the temperature drop amount of the BTM zone is taken as the temperature tilt.

Then, the in-plane uniformity regulation unit 101 notifies the user of the information of the temperature tilt calculated by the temperature regulation information calculation unit 107 via the user interface 95. At this time, the in-plane uniformity regulation unit 101 may display the information of the temperature tilt together with the information of the correction temperatures of the in-plane uniformity regulation illustrated in FIG. 4A. Further, the in-plane uniformity regulation unit 101 may display the temperature tilt separately for each of the plurality of zones (see, e.g., FIG. 6B) or may collectively display the respective temperature tilts for the plurality of zones. As a result, in a case where the inter-plane uniformity of the individual substrates W deteriorates by the correction temperatures of the in-plane uniformity regulation, the user may immediately recognize the information of the temperature tilt when the inter-plane uniformity regulation is performed again. Therefore, the user may perform the inter-plane uniformity regulation again with less effort.

The in-plane uniformity regulation unit 101 may be configured to automatically reflect the information of the temperature tilt calculated by the temperature regulation information calculation unit 107 in the correction temperatures without requiring the user's operation. As a result, the substrate processing apparatus 1 may further reduce the man-hour of the user to perform the temperature regulation method.

Figure 7:
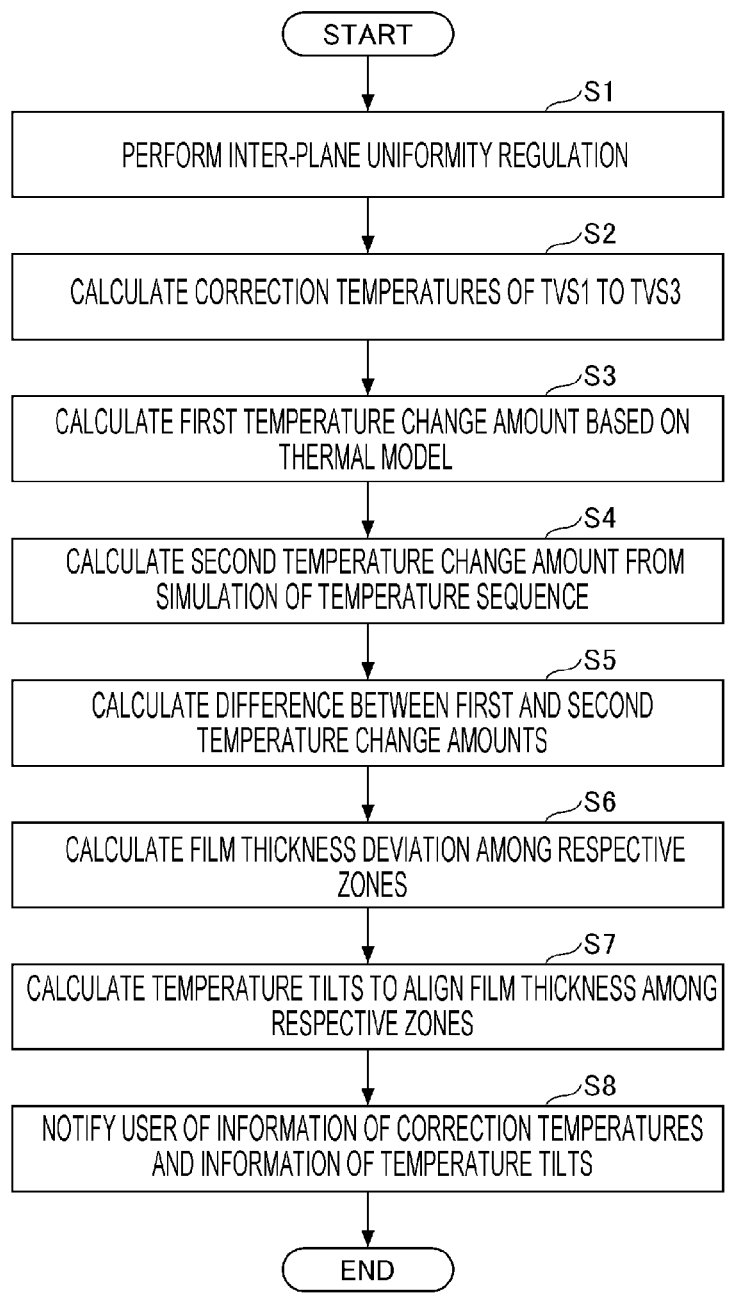
FIG. 7 is a flowchart illustrating a process flow of the temperature regulation method.

The substrate processing apparatus 1 according to the present embodiment is basically configured as described above, and the process flow of the temperature regulation method is described below with reference to FIG. 7.

To regulate the temperature of each substrate W during the substrate processing, the control unit 90 first performs the inter-plane uniformity regulation by the inter-plane uniformity regulation unit 100 (step S1). Thus, the inter-plane uniformity regulation unit 100 acquires the relative set temperatures of each zone of the processing container 10.

After calculating the set temperatures of each zone, the TVS calculation unit 102 of the in-plane uniformity regulation unit 101 calculates the temperature conditions (e.g., the correction temperatures and the performance time periods) of TVS1 to TVS3 in each zone, to perform the in-plane uniformity regulation (step S2). At this time, the TVS calculation unit 102 performs the optimization calculation for the temperature conditions of the in-plane uniformity regulation, by using the set temperatures of each zone calculated by the in-plane uniformity regulation unit 100 and the thermal models generated in advance. As a result, the correction temperatures of TVS1 to TVS3 may be obtained.

As described above, since the environment at the time of generating the thermal models is different to the environment at the time of actually performing the substrate processing in the substrate processing apparatus 1, the film thickness deviation occurs among the individual substrates W of the respective zones that have been subjected to the inter-plane uniformity regulation. Therefore, after calculating the temperature conditions of the in-plane uniformity regulation, the in-plane uniformity regulation unit 101 proceeds with the process of evaluating the film thickness deviation among the individual substrates W after the in-plane uniformity regulation.

First, the first temperature change amount calculation unit 103 calculates the first temperature change amount based on the calculated correction temperatures of each zone and the thermal models (step S3). The first temperature change amount is calculated as the change amount of the average temperature of TVS3 when the thermal models (the models in which the temperatures of TVS1 to TVS3 are changed in the range of 1° C. to 3° C.) are used.

Next, the second temperature change amount calculation unit 104 calculates the second temperature change amount by simulating the temperature sequence in accordance with the calculated correction temperatures of each zone and the temperature sequence that does not use the correction temperatures (step S4). The second temperature change amount is calculated as the change amount of the average temperature of TVS3 based on the actual temperature sequence (the widely varying temperature in TVS1 to TVS3).

The temperature comparison unit 105 calculates the temperature difference between the calculated first and second temperature change amounts, for each zone (step S5). As a result, the temperature deviation among the substrates W of the respective zones may be recognized.

Further, the film thickness information calculation unit 106 calculates the film thickness deviation among the substrates W of the respective zones, by using the map information PI of the process model and the temperature difference of each zone calculated by the temperature comparison unit 105 (step S6).

Then, the temperature regulation information calculation unit 107 calculates the temperature tilt to uniformize the film thickness among the individual substrates W of the respective zones, for each of the plurality of zones based on the film thickness deviation of the respective zones calculated by the film thickness information calculation unit 106 (step S7). As a result, the control unit 90 may easily estimate the temperature regulation amount in a case where the inter-plane uniformity regulation is performed again because of the occurrence of the film thickness deviation by the in-plane uniformity regulation.

Finally, the in-plane uniformity regulation unit 101 notifies the user of the information of the correction temperatures calculated by the TVS calculation unit 102 and the information of the temperature tilt calculated by the temperature regulation information calculation unit 107 via the user interface 95 (step S8). Thus, the user may simply reset the temperature of each zone when the inter-plane uniformity regulation is performed again.

As described above, the substrate processing apparatus 1 and the temperature regulation method performs the evaluation considering the inter-plane uniformity regulation during the in-plane uniformity regulation, and thus, may shorten (or eliminate) the inter-plane uniformity regulation after the in-plane uniformity regulation. As a result, for example, the number of substrates used for the regulation, the man-hours including labor costs, and the electric power or processing gas used for the regulation may be reduced, so that the efficiency and the cost reduction may be implemented.

The technical idea and effects of the present disclosure described in the embodiments above are described below.

According to a first aspect of the present disclosure, a substrate processing apparatus 1 includes: a processing container 10 that performs a substrate processing for forming a film on a plurality of substrates W; a temperature adjustment unit (temperature adjustment furnace 50) that adjusts a temperature of the plurality of substrates accommodated in the processing container for each of a plurality of zones set in advance; and a controller 90 that controls an operation of the temperature adjustment unit. The controller includes a calculation unit (TVS calculation unit 102) that calculates a correction temperature for uniformizing a film thickness within a plane of each substrate W based on a thermal model generated in advance, for each of the plurality of zones, a first temperature change amount calculation unit 103 that calculates a first temperature change amount for each of the plurality of zones based on the correction temperature calculated by the calculation unit and the thermal model, a second temperature change amount calculation unit 104 that performs a simulation of a temperature sequence using the correction temperature calculated by the calculation unit, thereby calculating a second temperature change amount based on the simulation for each of the plurality of zones, a temperature comparison unit 105 that calculates a temperature difference between the first and second temperature change amounts for each of the plurality of zones, a film thickness information calculation unit 106 that calculates information on a film thickness of a film being formed, for each of the plurality of zones based on the calculated temperature difference, and a temperature regulation information calculation unit 107 that calculates temperature regulation information (temperature tilt) for uniformizing the film thickness for each of the plurality of zones based on the information on the film thickness.

According to the configuration, even in a case where the film thicknesses among the plurality of substrates W deviates due to the in-plane temperature uniformity regulation, the substrate processing apparatus 1 may accurately estimate the film thickness deviation by using the first and second temperature change amounts. That is, the substrate processing apparatus 1 may easily obtain the temperature regulation information to uniformize the film thicknesses among the plurality of substrates W, as the information of the inter-plane uniformity re-regulation. As a result, the substrate processing apparatus 1 may efficiently regulate the temperature conditions when the film formation is performed on the plurality of substrates W, so that the man-hours and costs for the temperature regulation may be reduced.

For a uniform control of the film thickness within the plane of the substrate W, the controller 90 performs, before a film formation, a temperature changing process to raise or lower a temperature of the substrate and a standby process to stand by after the temperature changing process, and furthermore, performs, during the film formation, a film formation process that raises or lowers the temperature of the substrate W, and the thermal model is information obtained from simulating a temperature change of the film formation process when temperatures of the temperature changing process, the standby process, and the film formation process are changed. By performing the temperature changing process, the standby process, and the film formation process as described, the substrate processing apparatus 1 may efficiently achieve the uniformity of the film thickness within the plane of the substrate W.

The first temperature change amount calculation unit 103 calculates a change amount of an average temperature of the film formation process, as the first temperature change amount based on the thermal model. By using the correction temperature and the thermal model, the controller 90 may reproduce the temperature change of the film formation process according to the thermal model, and easily obtain the first temperature change amount of the film formation process.

The second temperature change amount calculation unit 104 calculates the change amount of the average temperature of the film formation process as the second temperature change amount, based on a difference between a simulation result of a temperature sequence when the correction temperature is used and a simulation result of a temperature sequence when the correction temperature is not used. As a result, the controller 90 may precisely recognize the temperature change of the film formation process based on the actual correction temperature.

The film thickness information calculation unit 106 calculates, as the information on the film thickness, a film thickness deviation among the plurality of substrates W in each of the plurality of zones, by using a process model held in advance in which the temperature of the substrate W and a film thickness are associated with each other, and the temperature difference calculated by the temperature comparison unit 105. As a result, the controller 90 may easily obtain the film thickness deviation for each of the plurality of zones based on the temperature difference.

The controller 90 notifies a user of the temperature regulation information calculated by the temperature regulation information calculation unit 107 and the correction temperature calculated by the calculation unit (TVS calculation unit 102). As a result, the substrate processing apparatus 1 may communicate the information necessary for the inter-plane uniformity regulation to the user, who may then set the inter-plane uniformity regulation based on the information.

The controller 90 automatically corrects the correction temperature, using the temperature regulation information calculated by the temperature regulation information calculation unit 107. As a result, the substrate processing apparatus 1 may simply correct the correction temperature calculated by the in-plane uniformity regulation, with the information considering the inter-plane uniformity regulation, so that, for example, the time required by the user may be further reduced.

According to a second aspect of the present disclosure, a temperature regulation method includes: providing a substrate processing apparatus 1 including a processing container 10, in which a substrate processing is performed to form a film on a plurality of substrates W, a temperature adjustment unit (temperature adjustment furnace 50) that adjusts a temperature of the plurality of substrates W accommodated in the processing container 10 for each of a plurality of zones set in advance; calculating a correction temperature for each of the plurality of zones to uniformize a temperature distribution within a plane of each substrate based on a thermal model generated in advance; calculating, for the of the plurality of zones, a first temperature change amount based on the correction temperature calculated in the calculating of the correction temperature and the thermal model; and performing a simulation of a temperature sequence by using the correction temperature calculated in the calculating of the correction temperature, thereby calculating a second temperature change amount for each of the plurality of zones based on the simulation; calculating a temperature difference between the first temperature change amount and the second temperature change amount for each of the plurality of zones; calculating, for each of the plurality of zones, information on a film thickness of a film being formed, based on the calculated temperature difference; and calculating temperature regulation information for uniformizing the film thickness for each of the plurality of zones based on the information on the film thickness. As a result, the temperature regulation method may efficiently the temperature conditions when the film formation is performed on the plurality of substrates.

According to an aspect of the present disclosure, temperature conditions when a film formation is performed on a plurality of substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a processing container configured to perform a substrate processing for forming a film on a plurality of substrates;
    a gas supply configured to supply a processing gas into the processing container;
    a temperature adjustment furnace configured to adjust a temperature of the plurality of substrates accommodated in the processing container for each of a plurality of zones set in advance; and
    a controller configured to control an operation of the temperature adjustment furnace,
    wherein the controller includes
        a calculation circuitry configured to calculate a correction temperature for uniformizing a film thickness within a plane of each substrate based on a target temperature and a thermal model set in advance, for each of the plurality of zones,
        a first temperature change amount calculation circuitry configured to calculate a first temperature change amount for each of the plurality of zones based on the correction temperature calculated by the calculation circuitry and the thermal model,
        a second temperature change amount calculation circuitry configured to perform a temperature sequence using a pre-correction temperature and the correction temperature calculated by the calculation circuitry respectively, thereby calculating a second temperature change amount based on the performance results for each of the plurality of zones,
        a temperature comparison circuitry configured to calculate a temperature difference between the first and second temperature change amounts for each of the plurality of zones,
        a film thickness information calculation circuitry configured to calculate information on a film thickness of a film being formed, for each of the plurality of zones based on the calculated temperature difference, and
        a temperature regulation information calculation circuitry configured to calculate temperature regulation information for uniformizing the film thickness for each of the plurality of zones based on the information on the film thickness, and
    the controller additionally corrects the correction temperature, using the temperature regulation information calculated by the temperature regulation information calculation circuitry, and controls the gas supply and the temperature adjustment furnace to supply the processing gas into the processing container while heating the plurality of substrates in the processing container to an additional correction temperature in order to form a film on each of the plurality of substrates.

2. The substrate processing apparatus according to claim 1, wherein the film thickness information calculation circuitry calculates, as the information on the film thickness, a film thickness deviation among the plurality of substrates in each of the plurality of zones, by using a process model held in advance in which the temperature of the substrate and a film thickness are associated with each other, and the temperature difference calculated by the temperature comparison circuitry.

3. The substrate processing apparatus according to claim 1, wherein the controller notifies a user of the temperature regulation information calculated by the temperature regulation information calculation circuitry and the correction temperature calculated by the calculation circuitry.

4. The substrate processing apparatus according to claim 1, wherein, for a uniform control of the film thickness within the plane of the substrate, the controller performs, before a film formation, a temperature changing process to raise or lower a temperature of the substrate and a standby process to stand by after the temperature changing process, and furthermore, performs, during the film formation, a film formation process that raises or lowers the temperature of the substrate, and the thermal model is information obtained from simulating a temperature change of the film formation process when temperatures of the temperature changing process, the standby process, and the film formation process are changed.

5. The substrate processing apparatus according to claim 4, wherein the calculation circuitry calculates time periods of each of the temperature changing process, the standby process, and the film formation process based on the target temperature and the thermal model, for each of the plurality of zones.

6. The substrate processing apparatus according to claim 4, wherein the temperature regulation information is information for shifting respective correction temperatures of the temperature changing process, the standby process, and the film formation process, as a whole.

7. The substrate processing apparatus according to claim 4, wherein the first temperature change amount calculation circuitry calculates a change amount of an average temperature of the film formation process, as the first temperature change amount based on the thermal model.

8. The substrate processing apparatus according to claim 7, the second temperature change amount calculation circuitry calculates the change amount of the average temperature of the film formation process as the second temperature change amount, based on a difference between a performance result of a temperature sequence when the correction temperature is used and a performance result of a temperature sequence when the correction temperature is not used.

9. A temperature regulation method comprising:
providing a substrate processing apparatus including
a processing container, in which a substrate processing is performed to form a film on a plurality of substrates,
a gas supply configured to supply a processing gas into the processing container,
a temperature adjustment furnace configured to adjust a temperature of the plurality of substrates accommodated in the processing container for each of a plurality of zones set in advance;
calculating a correction temperature for each of the plurality of zones to uniformize a temperature distribution within a plane of each substrate based on a target temperature and a thermal model set in advance;
calculating, for the of the plurality of zones, a first temperature change amount based on the correction temperature calculated in the calculating of the correction temperature and the thermal model; and
performing a temperature sequence by using a pre-correction temperature and the correction temperature calculated in the calculating of the correction temperature respectively, thereby calculating a second temperature change amount for each of the plurality of zones based on the performance results;
calculating a temperature difference between the first temperature change amount and the second temperature change amount for each of the plurality of zones;
calculating, for each of the plurality of zones, information on a film thickness of a film being formed, based on the temperature difference calculated;
calculating temperature regulation information for uniformizing the film thickness for each of the plurality of zones based on the information on the film thickness;
additionally correcting the correction temperature, using the temperature regulation information calculated by the temperature regulation information calculation circuitry; and
supplying the processing gas into the processing container while heating the plurality of substrates in the processing container to an additional correction temperature in order to form a film on each of the plurality of substrates.

* * * * *